(12) United States Patent
Büthker et al.

(10) Patent No.: US 11,539,351 B1
(45) Date of Patent: Dec. 27, 2022

(54) MODE DETECTOR FOR DC-DC CONVERTERS

(71) Applicant: NXP B.V., Eindhoven (NL)

(72) Inventors: Henricus Cornelis Johannes Büthker, Mierlo (NL); Jitendra Prabhakar Harshey, Karnataka (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/350,855

(22) Filed: Jun. 17, 2021

(51) Int. Cl.
| | |
|---|---|
| *H03K 3/037* | (2006.01) |
| *H03K 17/22* | (2006.01) |
| *G05F 3/08* | (2006.01) |
| *G05F 1/46* | (2006.01) |
| *H02M 3/00* | (2006.01) |

(52) U.S. Cl.
CPC ............. *H03K 3/037* (2013.01); *H03K 17/22* (2013.01); *G05F 1/46* (2013.01); *G05F 3/08* (2013.01); *H02M 3/00* (2013.01)

(58) Field of Classification Search
None
See application file for complete search history.

(56) References Cited

U.S. PATENT DOCUMENTS

| | | | |
|---|---|---|---|
| 4,617,473 A * | 10/1986 | Bingham | ................ H02J 9/061 327/63 |
| 5,875,339 A | 2/1999 | Molnar et al. | |
| 6,111,441 A | 8/2000 | Hartley et al. | |
| 6,970,032 B1 | 11/2005 | Smith et al. | |
| 8,013,473 B2 * | 9/2011 | Frew | ........................ H02J 1/10 307/130 |
| 8,364,989 B2 | 1/2013 | Zimek et al. | |
| 8,751,846 B2 | 6/2014 | Yu et al. | |
| (Continued) | | | |

FOREIGN PATENT DOCUMENTS

| | | |
|---|---|---|
| CN | 107947325 B | 1/2020 |
| EP | 2336844 A1 | 6/2011 |
| EP | 2544512 A1 | 1/2013 |

*Primary Examiner* — Jeffery S Zweizig (57) ABSTRACT

Various embodiments relate to a mode detector configured to determine a mode of a circuit based upon an attached power source, including: a first latch configured to hold an first input value and output the first held value and an inverse of the first held value; a second latch configured to hold a second input value and output the second held value and an inverse of the second held value; a first output switch connected between a first power source line and a power source output of the mode detector, wherein the first output switch is configured to be controlled by the output of the first latch; a second output switch connected between a second power source line and the power source output of the mode detector, wherein the second output switch is configured to be controlled by the output of the second latch; a first AND gate with a first input and a second input connected to the inverse output of the second latch, wherein the first input is configured to receive a first power on reset signal based upon the first power source line; and a second AND gate with a first input and a second input connected to the inverse output of the first latch, wherein the first input is configured to receive a second power on reset signal based upon the second power source line, wherein the mode of the circuit is indicated by the outputs of the first latch and the second latch.

19 Claims, 4 Drawing Sheets

(56) References Cited

U.S. PATENT DOCUMENTS

| | | | |
|---|---|---|---|
| 8,901,991 B2* | 12/2014 | Zanetta | ............... H03K 17/693 |
| | | | 327/407 |
| 9,929,730 B2 | 3/2018 | Spiel | |
| 2007/0002600 A1 | 1/2007 | May | |
| 2010/0026263 A1 | 2/2010 | Moussaoui et al. | |
| 2019/0207595 A1 | 7/2019 | Papriwal et al. | |
| 2020/0014239 A1 | 1/2020 | Liu | |

* cited by examiner

MODE DETECTOR FOR DC-DC CONVERTERS

TECHNICAL FIELD

Various exemplary embodiments disclosed herein relate generally to a mode detector for a DC-DC converter.

BACKGROUND

Various devices using integrated circuits (ICs) may include sections that require different power levels, for example about 1 V for low voltage sections and 2 V for higher voltage sections. For example, a health monitoring device may be configured to include a higher voltage 3 V battery source (i.e., two AA or AAA batteries) and a lower voltage 1.5 V battery source As result, when a lower voltage battery (1.5 V in this example) is used, the DC-DC converter will act as boost converter and generate the higher voltage (3 V in this example). Further, when a higher voltage battery (3 V in this example) is used, the DC-DC converter will act as buck converter and generate the lower voltage (1.5 V in this example).

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a mode detector configured to determine a mode of a circuit based upon an attached power source, including: a first latch configured to hold an first input value and output the first held value and an inverse of the first held value; a second latch configured to hold a second input value and output the second held value and an inverse of the second held value; a first output switch connected between a first power source line and a power source output of the mode detector, wherein the first output switch is configured to be controlled by the output of the first latch; a second output switch connected between a second power source line and the power source output of the mode detector, wherein the second output switch is configured to be controlled by the output of the second latch; a first AND gate with a first input and a second input connected to the inverse output of the second latch, wherein the first input is configured to receive a first power on reset signal based upon the first power source line; and a second AND gate with a first input and a second input connected to the inverse output of the first latch, wherein the first input is configured to receive a second power on reset signal based upon the second power source line, wherein the mode of the circuit is indicated by the outputs of the first latch and the second latch.

Various embodiments are described, further including a maximum voltage selector connected to the first power source line and the second power source line configured to produce an output voltage that is the maximum of a voltage the first power source line and a voltage the second power source line at an output, wherein the output voltage powers the mode detector.

Various embodiments are described, wherein the maximum voltage selector includes: a first transistor with source connected to a first power source line, a gate connected to the second power source line, a drain connected to the output of the maximum voltage selector, and a back gate of the first transistor is connected to the drain of the first transistor; a second transistor with source connected to a second power source line, a gate connected to the first power source line, a drain connected to the output of the maximum voltage selector, and a back gate of the second transistor is connected to the drain of the second transistor.

Various embodiments are described, further including an OR gate with inputs connected to the output of the first latch and the output of the second latch configured to produce a system power on reset signal.

Various embodiments are described, further including: a first power on reset circuit connected to the first power source line, configured to produce the first power on reset signal; and a second power on reset circuit connected to the second power source line, configured to produce the second power on reset signal.

Various embodiments are described, further including: a first switch connected to the first power source line, wherein the first switch is controlled by the inverse output of the first latch; a first power on reset circuit connected to the first switch configured to produce the first power on reset signal; a second switch connected to the second power source line, wherein the second switch is controlled by the inverse output of the second latch; and a second power on reset circuit connected to the second switch configured to produce the second power on reset signal.

Various embodiments are described, wherein the first latch is a flip-flop, and the second latch is a flip-flop.

Further various embodiments relate to an integrated circuit, including: a circuit, wherein the circuit is configured to operate using either a first power source or a second power source; a mode detector configured to determine a mode of the circuit based upon an attached power source that is either the first power source or the second power source, including a first latch configured to hold an first input value and output the first held value and an inverse of the first held value; a second latch configured to hold a second input value and output the second held value and an inverse of the second held value; a first output switch connected between the first power source line and a power source output of the mode detector, wherein the first output switch is configured to be controlled by the output of the first latch; a second output switch connected between the second power source line and the power source output of the mode detector, wherein the second output switch is configured to be controlled by the output of the second latch; a first AND gate with a first input and a second input connected to the inverse output of the second latch, wherein the first input is configured to receive a first power on reset signal based upon the first power source line; and a second AND gate with a first input and a second input connected to the inverse output of the first latch, wherein the first input is configured to receive a second power on reset signal based upon the second power source line, wherein the mode of the circuit is indicated by the outputs of the first latch and the second latch.

Various embodiments are described, further including a maximum voltage selector connected to the first power source line and the second power source line configured to produce an output voltage that is the maximum of a voltage the first power source line and a voltage the second power source line at an output, wherein the output voltage powers the mode detector.

Various embodiments are described, wherein the maximum voltage selector includes: a first transistor with source connected to a first power source line, a gate connected to the second power source line, a drain connected to the output of the maximum voltage selector, and a back gate of the first transistor is connected to the drain of the first transistor; a second transistor with source connected to a second power source line, a gate connected to the first power source line, a drain connected to the output of the maximum voltage selector, and a back gate of the second transistor is connected to the drain of the second transistor.

Various embodiments are described, further including an OR gate with inputs connected to the output of the first latch and the output of the second latch configured to produce a system power on reset signal.

Various embodiments are described, further including: a first power on reset circuit connected to the first power source line, configured to produce the first power on reset signal; and a second power on reset circuit connected to the second power source line, configured to produce the second power on reset signal.

Various embodiments are described, further including: a first switch connected to the first power source line, wherein the first switch is controlled by the inverse output of the first latch; a first power on reset circuit connected to the first switch configured to produce the first power on reset signal; a second switch connected to the second power source line, wherein the second switch is controlled by the inverse output of the second latch; and a second power on reset circuit connected to the second switch configured to produce the second power on reset signal.

Various embodiments are described, wherein the circuit is one of a DCDC converter, a low dropout regulator, an analog to digital converter, a current source, and a bandgap reference voltage generator.

Further various embodiments relate to an integrated circuit, including: a circuit, wherein the circuit is configured to operate using either a first power source or a second power source; a first power on reset circuit connected to the first power source line configured to produce a first power on reset signal; a second power on reset circuit connected to the second power source line configured to produce a second power on reset signal; and a mode detector configured to determine a mode of the circuit based upon first power on reset signal and the second power on reset signal.

Various embodiments are described, wherein the mode detector further includes: a first latch configured to hold an first input value and output the first held value and an inverse of the first held value; a second latch configured to hold a second input value and output the second held value and an inverse of the second held value; a first output switch connected between the first power source line and a power source output of the mode detector, wherein the first output switch is configured to be controlled by the output of the first latch; a second output switch connected between the second power source line and the power source output of the mode detector, wherein the second output switch is configured to be controlled by the output of the second latch; a first AND gate with a first input and a second input connected to the inverse output of the second latch, wherein the first input is configured to receive a first power on reset signal based upon the first power source line; and a second AND gate with a first input and a second input connected to the inverse output of the first latch, wherein the first input is configured to receive a second power on reset signal based upon the second power source line, wherein the mode of the circuit is indicated by the outputs of the first latch and the second latch.

Various embodiments are described, further including: a first switch connected between first the power source line and the first power on reset circuit, wherein the first switch is controlled by the inverse output of the first latch; and a second switch connected between the second power source line and the second power on reset circuit, wherein the second switch is controlled by the inverse output of the second latch.

Various embodiments are described, further including a maximum voltage selector connected to the first power source line and the second power source line configured to produce an output voltage that is the maximum of a voltage the first power source line and a voltage the second power source line at an output, wherein the output voltage powers the mode detector.

Various embodiments are described, further including an OR gate with inputs connected to the output of the first latch and the output of the second latch configured to produce a system power on reset signal.

Various embodiments are described, wherein the circuit is one of a DCDC converter, a low dropout regulator, an analog to digital converter, a current source, and a bandgap reference voltage generator.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

Figure 1:
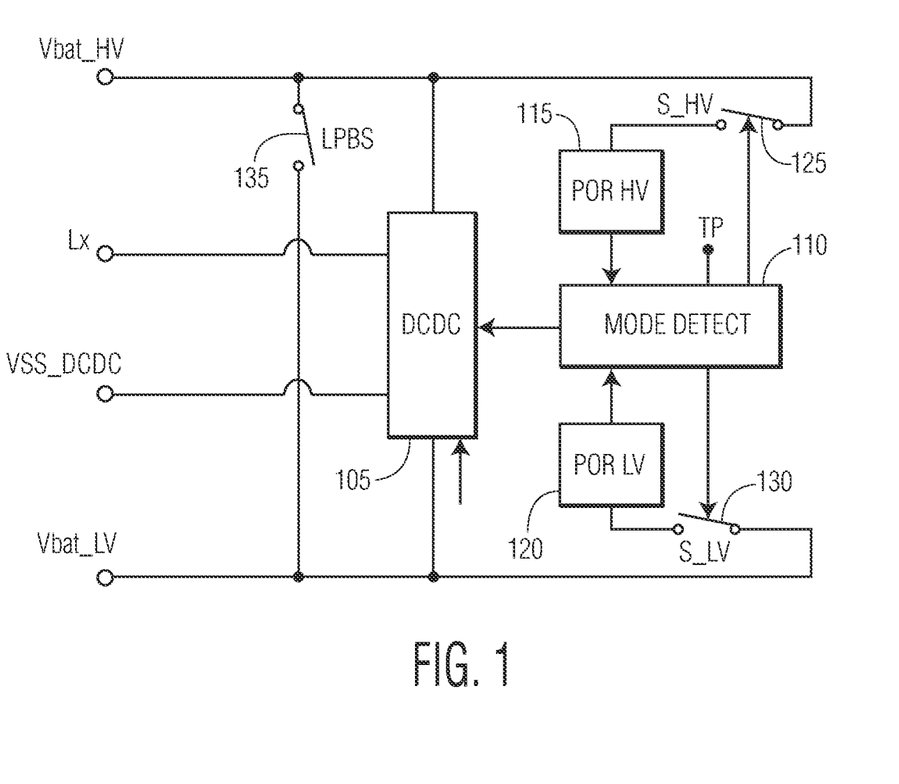
FIG. 1 illustrates a DCDC converter for use on an integrated circuit.

FIG. 1 illustrates a DCDC converter for use on an integrated circuit (IC). The DCDC converter is set up so that either a low battery voltage Vbat_LV or a high battery voltage Vbat_HV may be applied to power the IC. The IC is further configured to automatically detect the voltage source applied by the batteries, as the user is able to use either type of battery to power the IC. This automatic detection of the available battery voltage will be accomplished in a way that reduces the drain on the battery sources.

The IC 100 includes a DCDC converter 105, a mode detector 110, a high voltage power on reset (POR HV 115), and a low voltage power on resent (POR LV) 120. The DCDC converter 105 includes both a boost converter and a buck converter. The boost converter may take a lower voltage and boost to a higher voltage, and the buck converter may take a higher voltage and drop it to a lower voltage. The DCDC converter has an Lx pin that is connected to an inductor and this Lx pin receives the switching signal. The VSS_DCDC pin provides a ground to the DCDC converter 105. The POR HV 115 detects the presence of a voltage on the Vbat_HV line, and when such a voltage is detected, the mode detector 110 will set the DCDC converter 105 to buck operation mode to produce the voltage Vbat_LV on the low voltage line. The POR HV 115 detects the presence of a voltage on the Vbat_HV line, and when such a voltage is detected, the mode detector 110 will set the DCDC converter 105 to buck operation mode to produce the voltage Vbat_LV on the low voltage line.

Once the mode detector 110 detects the presence of one of the battery voltages, the mode of the mode detector 110 will not change if the voltages on Vbat_LV or Vbat_HV change after the mode was determined. For example, if the Vbat_LV is detected, the DCDC converter 105 will produce Vbat_HV which may cause the POR HV to detect that voltage and provide an input to the mode detector that Vbat_HV is present. The mode detector 110 is designed to avoid this as will be described below.

In order to reduce the current draw of the PORs, POR switches 125 and 130 are controlled by the mode detector 110. When the mode detector 110 determines the presence of the Vbat_LV or Vbat_HV, the mode detector 110 will cause the POR switches 125 and 130 to open so that the POR HV 115 and POR LV 120 cannot now signal the presence of the battery voltage Vbat_HV or Vbat_LV which will reduce power consumption.

Also a low power bypass switch (LPBS) 135 may be used when the DCDC converter 105 is off or in some low power mode to provide a voltage on a both of the battery lines that will then result in an equal supply. In this situation the IC is in a very low power mode and consumes only a few microamps.

Further, the mode detector 110 will assert the determined mode information in all power modes until the battery is disconnected. Also, there should be no static current consumption and minimum leakage to maximize the lifetime of the battery. In some applications, the 1.5 V battery is a silver-oxide button cell with very low capacity and high internal resistance. In such an application, the leakage of the mode detector 110 should remain below 10 nA.

Figure 2:
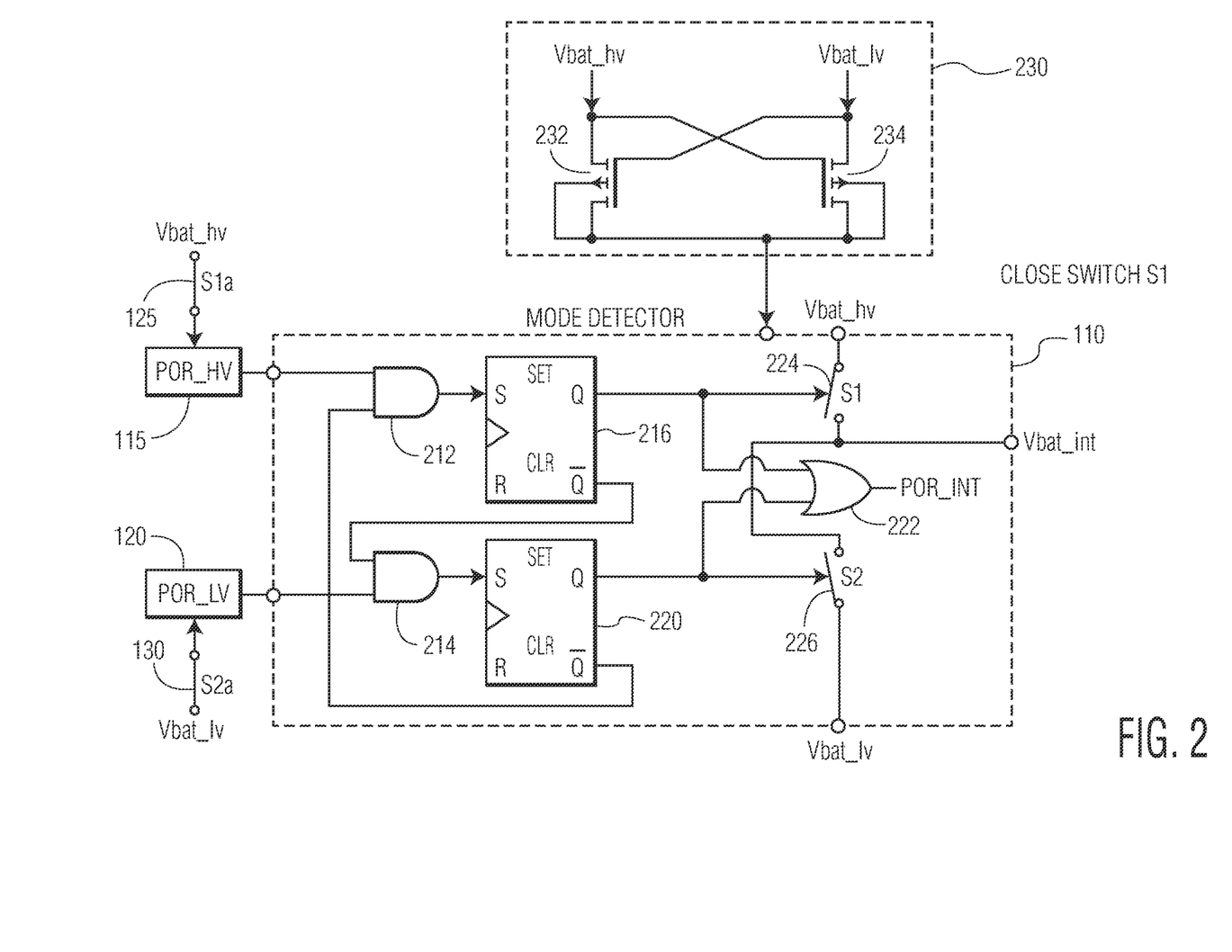
FIG. 2 is a block diagram of the mode detector and the power source for the mode detector.

FIG. 2 is a block diagram of the mode detector and the power source for the mode detector. The mode detector system includes the following key features: the use of two POR blocks (one each for Vbat_LV and Vbat_HV); a latch with two RS flipflops to avoid using a clock; a power supply for the latch; and the generation of a POR signal POR_INT for the rest of the system.

Figure 3:
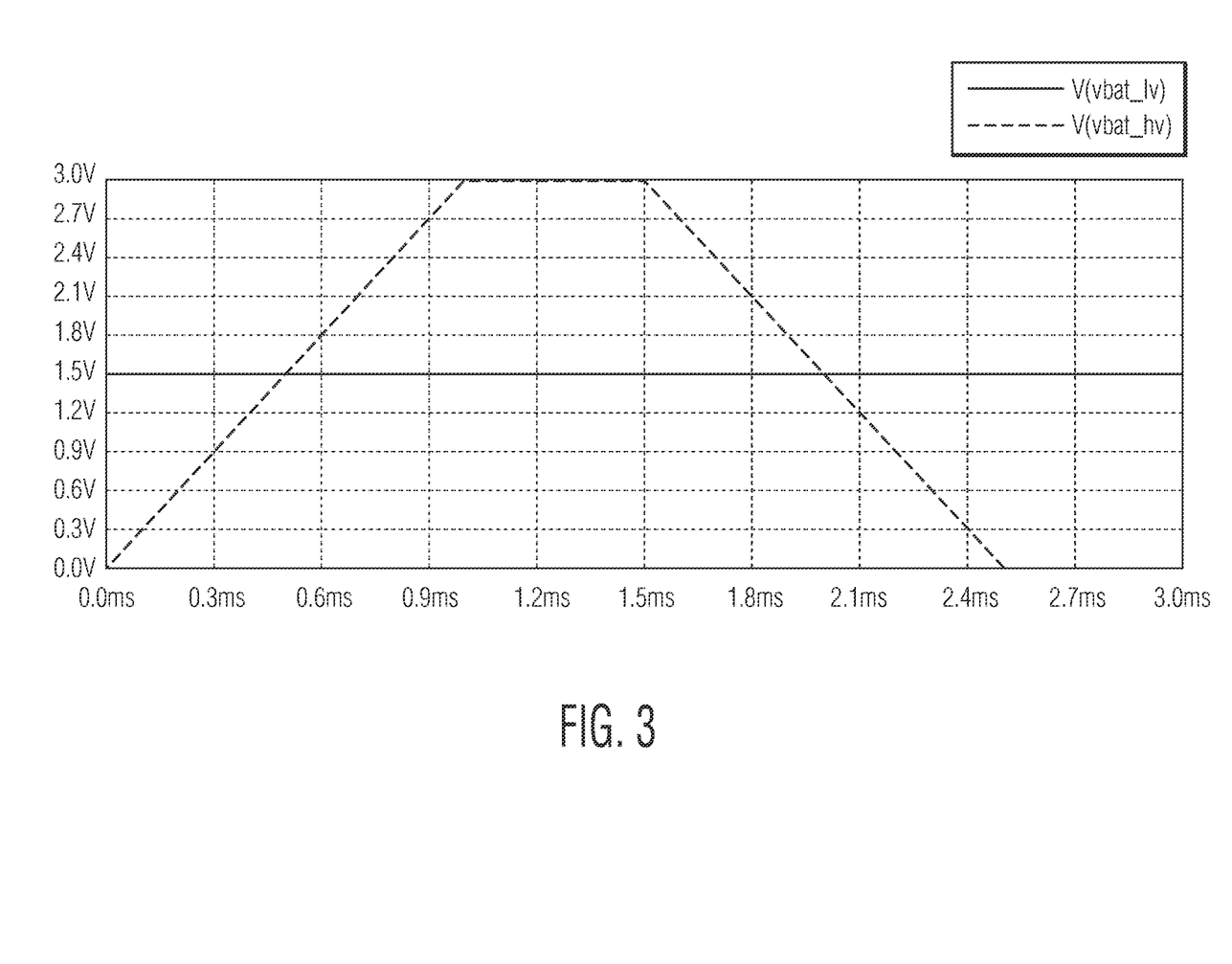
FIG. 3 shows a plot of Vbat_LV and Vbat_HV input into the maximum voltage selector over time.
Figure 4:
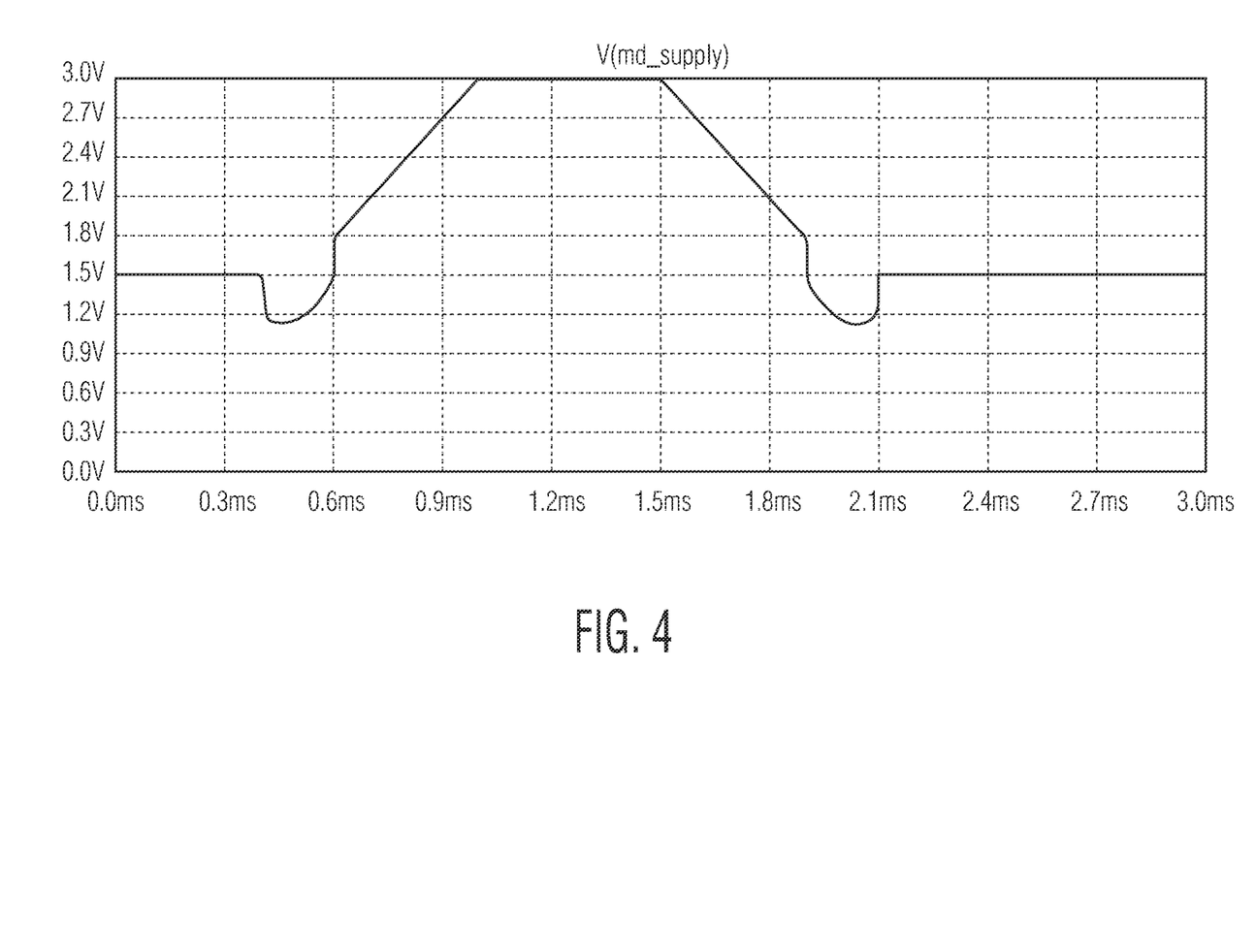
FIG. 4 illustrates the output of the maximum voltage detector when the input voltages are as found in FIG. 3.

A maximum voltage selector 230 supplies power to the mode detector 110 before a POR. The maximum voltage selector 230 receives both battery voltages Vbat_LV and Vbat_HV. The maximum voltage selector 230 includes two transistors 232 and 234. The first transistor 232 has a source connected to Vbat_HV, a gate connected to Vbat_LV, and a drain connected to the output of the maximum voltage selector. The second transistor 234 has a source connected to Vbat_LV, a gate connected to Vbat_HV, and a drain connected to the output of the maximum voltage selector. Further, the back gate of each transistor is connected to the source or output of the transistor. If one supply line is at least one Vt higher than the other, the corresponding PMOS will start to conduct. The result is the higher of the two input voltages is output to power the mode detector. FIG. 3 shows a plot of Vbat_LV and Vbat_HV input into the maximum voltage selector over time. Vbat_LV is constant at 1.5 V over time. The Vbat_HV increases from 0 V to 3.0 V linearly over time, then stays at 3.0 V for a period of time, then drops back to 0 V linearly. FIG. 4 illustrates the output of the maximum voltage detector when the input voltages are as found in FIG. 3. As can be seen the output of the maximum voltage selector is 1.5 V until the value of Vbat_HV approaches 1.5 V at which time the output voltage drops about 0.3 V before then recovering and increasing to 3 V. Accordingly, in this example, the difference between Vbat_LV and Vbat_HV should be greater than 0.3 V for the circuit to operate properly.

Once one of the PORs 115, 120 has detected sufficient battery voltage and the mode has been detected, the supply for the mode detector 110 is taken over by internal switches (not shown) and connected to either Vbat_LV or Vbat_HV.

The PORs 115, 120 are circuits where the output voltage is kept low until a certain threshold value is reached. For example, in the example herein, a threshold voltage of 1 V may be used for POR LV, and a threshold voltage of 1.4 may be used for POR_HV. Accordingly, once one of the batteries are attached to produce either Vbat_HV or Vbat_LV, the associated POR will produce an output voltage that is supplied to the mode detector 110.

The mode detector 110 includes two AND gates 212, 214, two flip-flops (or latches) 216, 220, an OR gate 222, and switches 224, 226. The two flip-flops 216, 220 form a latch which is reset at power up before either of the PORs 115, 120 is released. This defines the state of the flip-flops 216, 220 before anything in the system is active. As a result, no clock is needed in the system to reset the flip-flops which saves current. The flip-flops receive an input from AND gates 212, 214 which is then held until the flip-flops 216, 220 are reset. Each of the flip-flops 216, 220 produce an output value based upon the value held by the flip-flop as well as an inverse of that output.

A first AND gate 212 receives as inputs the output of the POR HV 115 and the inverse output of the second flip-flop 220. A second AND gate receives as input the output of the POR LV 120 and the inverse output of the first flip-flop 216. This means that the output of the AND gates 212, 214 will only be 1 when its respective POR is triggered and the opposite flip-flop is holding a 0 value, i.e., the opposite flip-flop is outputting a 1 at its inverse output. As a result, only one of the flip-flops 216, 220 can hold a value of 1 at any given time. For example, if the POR HV detects a Vbat_HV voltage and asserts an output of 1. As the flip-flop 220 was reset to holding a 0 at startup, it asserts a 1 at the inverse output. Accordingly, the AND gate 212 outputs a 1, which is held in the flip-flop 216. So the output of flip-flop 216 is now 1 and the inverse output is 0. As the inverse output of flip-flop 216 is input into the second AND gate 214, no matter what the POR LV outputs to the second AND gate 214, the output of the second AND gate 214 will always be 0 until the flip-flop 216 is reset. So even if Vbat_LV is asserted and the POR LV 120 detects this and outputs a 1, the second flip-flop will still hold a 0. This arrangement means that whichever battery voltage is first available, the mode detector 110 will detect that voltage and cause the detected battery voltage to be asserted at an output Vbat_int until the system is reset.

A first output switch 224 is controlled by the output of the first flip-flop 216, and first output switch 224 is closed when the output of the first flip-flop 216 is 1. When the first output switch 224 is closed, it connects Vbat_LV to the output Vbat_int. Also, a second output switch 226 is controlled by the output of the second flip-flop 220, and second output switch 226 is closed when the output of the second flip-flop 220 is 1. When the second output switch 226 is closed, it connects Vbat_HV to the output Vbat_int. Further, the outputs of the first flip-flop 216 and the second flip-flop 220 are ORed by OR gate 222 to produce a POR_INT signal, which is a system power on reset signal provided to other parts of the system on the IC. Accordingly, when either POR HV 115 or POR LV 120 detects a battery voltage, the system POR_INT signal is generated.

The mode detector also may provide the outputs of the two flip-flops 216, 220 to the DCDC converter 105 to indicate the mode indication. For example, the output of the first flip-flop 216 may indicate a buck mode, and the output of the second flip-flop 220 may indicate the boost mode. In another embodiment, the outputs of the two flip-flops 216, 220 may be combined to provide a 1 bit indication of which mode the should be used.

As the mode detector operates without clock, current consumption is reduced. The flip-flops act as a memory element to preserve at least 3 states: undefined; boost mode; and buck mode. This requires 2 bits to define at least 3 states. The two flip-flops store the information. Both flip-flops are reset at power up, before either of the PORs can be active, so the output is then "00" at power up.

The PORs provide a signal to the mode detector when a battery is connected. The current consumption of the PORs is a few A, which is not a problem for regular AA batteries or rechargeable batteries. But for a small silver-oxide battery, it results a significant reduction of useful life of the battery. These batteries may only be designed for 100 μA. In order to remove the drain on the batteries cause by the PORs, each POR is switched off after one of the PORs detects a battery voltage. This is accomplished using POR switches 125, 130. A first POR switch 125 is connected between Vbat_HV and the POR HV 115 and is controlled by the inverted output of the first flip-flop 216. At start up, this POR switch 125 will be closed because the first flip-flop 216 holds a 0, so the inverted output is 1. Likewise, a second POR switch 130 is connected between Vbat_LV and the POR LV 120 and is controlled by the inverted output of the second flip-flop 220. At start up this POR switch 130 will be closed because the second flip-flop 220 holds a 0, so the inverted output is 1. Accordingly, once one of the PORs detects the presence of a battery, that POR will be disconnected from that battery once the mode detector detects 110 the mode. As a result, that battery will not have the POR drawing current from it after detection.

While FIG. 2 illustrates the mode detector 110 as including the AND gates 212, 214, flip-flops 216, 220, output switches 225, 226, and OR gate 222, the mode detector 110 may also include the maximum voltage selector 230, the POR HV 115, POR LV 120, and/or POR switches 125, 130 in any combination.

While the mode converter is described as being used with a DCDC converter, it may be used with other types of circuits that may receive and operate off of two different level power sources such as different types of batteries. The mode converted described herein may also be used with for example, an analog to digital converter (ADC), current source, a low dropout regulator (LDO), or a bandgap reference voltage generator. The ADC, may for example, measure the battery voltage, no matter to which terminal the battery is connected and the mode detector will identify when a batter has been connected. In another example, a bias current generator may need to be always connected to the battery, so the mode detector may indicate which battery line has a batter attached and the bias current generator connects to that line. In another example, an IC may have a number of blocks depending on the mode detector state including a low power LDO and a bandgap reference voltage generator. The IC may have two supply switches that are controlled by the mode detector: one connects to Vbat_HV if a battery is detected on Vbat_HV. The other switch does the same for Vbat_LV. The result is that these blocks are always connected to a battery, so that a battery may be connected to either Vbat_LV or Vbat_HV.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A mode detector configured to determine a mode of a circuit based upon an attached power source, comprising:
   a first latch configured to hold a first input value and output a first held value and an inverse of the first held value;
   a second latch configured to hold a second input value and output a second held value and an inverse of the second held value;
   a first output switch connected between a first power source line and a power source output of the mode detector, wherein the first output switch is configured to be controlled by an output of the first latch;
   a second output switch connected between a second power source line and the power source output of the mode detector, wherein the second output switch is configured to be controlled by an output of the second latch;
   a first AND gate with a first input and a second input connected to an inverse output of the second latch, wherein the first input is configured to receive a first power on reset signal based upon the first power source line; and
   a second AND gate with a first input and a second input connected to an inverse output of the first latch, wherein the first input is configured to receive a second power on reset signal based upon the second power source line,
   wherein the mode of the circuit is indicated by the outputs of the first latch and the second latch.

2. The mode detector of claim 1, further comprising a maximum voltage selector connected to the first power source line and the second power source line configured to produce an output voltage that is the maximum of a voltage the first power source line and a voltage the second power source line at an output, wherein the output voltage powers the mode detector.

3. The mode detector of claim 2, wherein the maximum voltage selector comprises:
a first transistor with source connected to the first power source line, a gate connected to the second power source line, a drain connected to the output of the maximum voltage selector, and a back gate of the first transistor is connected to the drain of the first transistor;
a second transistor with source connected to the second power source line, a gate connected to the first power source line, a drain connected to the output of the maximum voltage selector, and a back gate of the second transistor is connected to the drain of the second transistor.

4. The mode detector of claim 1, further comprising an OR gate with inputs connected to the output of the first latch and the output of the second latch configured to produce a system power on reset signal.

5. The mode detector of claim 1, further comprising:
a first power on reset circuit connected to the first power source line, configured to produce the first power on reset signal; and
a second power on reset circuit connected to the second power source line, configured to produce the second power on reset signal.

6. The mode detector of claim 1, further comprising:
a first switch connected to the first power source line, wherein the first switch is controlled by the inverse output of the first latch;
a first power on reset circuit connected to the first switch configured to produce the first power on reset signal;
a second switch connected to the second power source line, wherein the second switch is controlled by the inverse output of the second latch; and
a second power on reset circuit connected to the second switch configured to produce the second power on reset signal.

7. The mode detector of claim 1, wherein
the first latch is a flip-flop, and
the second latch is a flip-flop.

8. An integrated circuit, comprising:
a circuit, wherein the circuit is configured to operate using either a first power source line or a second power source line;
a mode detector configured to determine a mode of the circuit based upon an attached power source that is either the first power source line or the second power source line, comprising
a first latch configured to hold a first input value and output a first held value and an inverse of the first held value;
a second latch configured to hold a second input value and output a second held value and an inverse of the second held value;
a first output switch connected between the first power source line and a power source output of the mode detector, wherein the first output switch is configured to be controlled by an output of the first latch;
a second output switch connected between the second power source line and the power source output of the mode detector, wherein the second output switch is configured to be controlled by an output of the second latch;
a first AND gate with a first input and a second input connected to an inverse output of the second latch, wherein the first input is configured to receive a first power on reset signal based upon the first power source line; and
a second AND gate with a first input and a second input connected to an inverse output of the first latch, wherein the first input is configured to receive a second power on reset signal based upon the second power source line,
wherein the mode of the circuit is indicated by the outputs of the first latch and the second latch.

9. The integrated circuit of claim 8, further comprising a maximum voltage selector connected to the first power source line and the second power source line configured to produce an output voltage that is the maximum of a voltage the first power source line and a voltage the second power source line at an output, wherein the output voltage powers the mode detector.

10. The integrated circuit of claim 9, wherein the maximum voltage selector comprises:
a first transistor with source connected to the first power source line, a gate connected to the second power source line, a drain connected to the output of the maximum voltage selector, and a back gate of the first transistor is connected to the drain of the first transistor;
a second transistor with source connected to the second power source line, a gate connected to the first power source line, a drain connected to the output of the maximum voltage selector, and a back gate of the second transistor is connected to the drain of the second transistor.

11. The integrated circuit of claim 8, further comprising an OR gate with inputs connected to the output of the first latch and the output of the second latch configured to produce a system power on reset signal.

12. The integrated circuit of claim 8, further comprising:
a first power on reset circuit connected to the first power source line, configured to produce the first power on reset signal; and
a second power on reset circuit connected to the second power source line, configured to produce the second power on reset signal.

13. The integrated circuit of claim 8, further comprising:
a first switch connected to the first power source line, wherein the first switch is controlled by the inverse output of the first latch;
a first power on reset circuit connected to the first switch configured to produce the first power on reset signal;
a second switch connected to the second power source line, wherein the second switch is controlled by the inverse output of the second latch; and
a second power on reset circuit connected to the second switch configured to produce the second power on reset signal.

14. The integrated circuit of claim 8, wherein the circuit is one of a DCDC converter, a low dropout regulator, an analog to digital converter, a current source, and a bandgap reference voltage generator.

15. An integrated circuit, comprising:
a circuit, wherein the circuit is configured to operate using either a first power source line or a second power source line;
a first power on reset circuit connected to the first power source line configured to produce a first power on reset signal;
a second power on reset circuit connected to the second power source line configured to produce a second power on reset signal; and a mode detector configured to determine a mode of the circuit based upon the first power on reset signal and the second power on reset signal;

wherein the mode detector further comprises:
   a first latch configured to hold a first input value and output a first held value and an inverse of the first held value;
   a second latch configured to hold a second input value and output a second held value and an inverse of the second held value;
   a first output switch connected between the first power source line and a power source output of the mode detector, wherein the first output switch is configured to be controlled by an output of the first latch;
   a second output switch connected between the second power source line and the power source output of the mode detector, wherein the second output switch is configured to be controlled by an output of the second latch;
   a first AND gate with a first input and a second input connected to an inverse output of the second latch, wherein the first input is configured to receive the first power on reset signal based upon the first power source line; and
   a second AND gate with a first input and a second input connected to an inverse output of the first latch, wherein the first input is configured to receive the second power on reset signal based upon the second power source line, and
   wherein the mode of the circuit is indicated by the outputs of the first latch and the second latch.

16. The integrated circuit of claim 15, further comprising:
   a first switch connected between the first the power source line and the first power on reset circuit, wherein the first switch is controlled by the inverse output of the first latch; and
   a second switch connected between the second power source line and the second power on reset circuit, wherein the second switch is controlled by the inverse output of the second latch.

17. The integrated circuit of claim 15, further comprising a maximum voltage selector connected to the first power source line and the second power source line configured to produce an output voltage that is the maximum of a voltage the first power source line and a voltage the second power source line at an output, wherein the output voltage powers the mode detector.

18. The integrated circuit of claim 15, further comprising an OR gate with inputs connected to the output of the first latch and the output of the second latch configured to produce a system power on reset signal.

19. The integrated circuit of claim 15, wherein the circuit is one of a DCDC converter, a low dropout regulator, an analog to digital converter, a current source, and a bandgap reference voltage generator.

\* \* \* \* \*